United States Patent [19]

Jackson

[11] 4,281,738

[45] Aug. 4, 1981

[54] SPHERICAL LOUDSPEAKER ENCLOSURE

[76] Inventor: Michael Jackson, 4524 N. 35th Pl., Phoenix, Ariz. 85018

[21] Appl. No.: 107,153

[22] Filed: Dec. 26, 1979

Related U.S. Application Data

[63] Continuation of Ser. No. 896,695, Apr. 17, 1978, abandoned.

[51] Int. Cl.[3] ............................................... H05K 5/00

[52] U.S. Cl. .................................... 181/151; 181/153; 181/199; 181/DIG. 1

[58] Field of Search ............... 181/153, 199, 148, 151, 181/DIG. 1, 145, 146, 156; 179/1 E

[56] References Cited

U.S. PATENT DOCUMENTS

| | | | |
|---|---|---|---|
| 2,096,192 | 10/1937 | Moore | 181/153 |
| 2,138,717 | 11/1938 | Volk | 181/151 |
| 2,775,309 | 12/1956 | Villehur | 181/151 |
| 2,881,850 | 4/1959 | Bonn | 181/153 |
| 3,026,955 | 3/1962 | Wilber | 181/153 |
| 3,026,956 | 3/1962 | Wilber | 181/153 |
| 3,192,322 | 6/1965 | Leslie | 181/151 |
| 3,275,100 | 9/1966 | Dunning | 181/146 |
| 3,500,953 | 3/1970 | Lahti | 181/153 |
| 3,720,285 | 3/1973 | Russell et al. | 181/151 |
| 3,812,301 | 5/1974 | Lahti | 181/153 |
| 3,819,005 | 6/1974 | Westlund | 181/153 |
| 4,057,689 | 11/1977 | Stallings, Jr. | 181/153 |

*Primary Examiner*—L. T. Hix
*Assistant Examiner*—Benjamin R. Fuller
*Attorney, Agent, or Firm*—LaValle D. Ptak

[57] ABSTRACT

A loudspeaker enclosure of the acoustic suspension type has a hollow interior of a generally spherical shape, and the enclosure is formed of polyurethane foamed plastic in which the volume (V) of the enclosure interior is determined according to the following empirical formula:

$$V=[MD]^3$$

where M is the distance between the limits of mechanical excursion of a given loudspeaker mounted in an aperture in the enclosure as the diaphragm of the speaker is moved under a constant mechanical force, and D is the diameter of the loudspeaker.

8 Claims, 6 Drawing Figures

SPHERICAL LOUDSPEAKER ENCLOSURE

This is a continuation of application Ser. No. 896,695, filed Apr. 17, 1978, now abandoned.

BACKGROUND OF THE INVENTION

In the field of high fidelity music reproduction systems, substantial and continuous efforts are being made to obtain sound reproduction which is as faithful as possible to the original sounds to be reproduced by the high fidelity system. The problem is most acute for lower frequency sounds, otherwise known as bass sounds; and most speaker systems fail to faithfully reproduce such bass sounds. In many systems, the inherent resonant frequency of the speaker and the enclosure with which it is combined function to produce "booming" or unnatural emphasis of bass tones of particular frequencies, while de-emphasizing other frequencies.

In most systems, tones are reproduced by a diaphragm of the loudspeaker which is moved by a combination of a permanent magnet and voice coil to which the tone signals representative of the sound are applied. As the diaphragm vibrates, sound waves are propagated by it both in front of and behind the loudspeaker. The signals on opposite sides of the loudspeaker are 180° out of phase with each other, so that provisions must be made for preventing the sound wave at the rear of the speaker from cancelling the front sound wave. This is accomplished by mounting the speaker in an appropriate enclosure which is employed to contain or dissipate the rear sound wave and permit free radiation of the front sound wave from the speaker.

The rear sound wave is useful only if it is in phase or augments the front sound wave, and various complex baffle speaker arrangements have been developed to accomplish such an inversion of the rear sound wave. In most cases, however, speaker systems which use this principle have a characteristic of peaking or booming at certain frequencies and consequently produce an unrealistic response over the range of frequencies reproduced by such systems.

Many prior art speaker enclosures are operated on the principle of an "infinite baffle" which ideally completely separates the rear sound wave from the front sound wave. In such a speaker, it is desirable to have the enclosure as large as possible; and since there are definite practical limitations to accomplishing this result, such speakers generally compromise the size of the speaker enclosure by internal baffles, filling the speaker enclosure with sound deadening materials, such as fiber glass and the like, and perforating the back of the speaker enclosure.

Another type of speaker enclosure which has achieved substantial popularity in recent years is a sealed air or acoustic suspension speaker enclosure. This type of enclosure utilizes an air tight cabinet or box in contrast to bass reflex or infinite baffle systems which are not air tight. Such acoustic suspension systems can employ speakers having a diaphragm which is more elastic than the diaphragms used in bass reflex speaker cabinets since the restoring force for the diaphragm is provided in large part by the confined air mass behind the speaker and does not depend so much on the mechanical elastic suspensions of the diaphragm itself, particularly at large diaphragm excursions. By utilizing a loudspeaker of reduced elastic stiffness, improved linearity of response has been attained when the speaker is properly matched to its cabinet enclosure. A primary disadvantage of acoustic suspension systems, however, is that they are relatively inefficient, requiring higher power amplifiers than bass reflex systems.

In spite of the relative sophistication of the speaker/enclosure art, the tones reproduced by speaker systems, either of the acoustic suspension type or the bass reflex type (infinite baffle) are not as realistic as desired by serious listeners. Much of the distortion which is produced by conventional speaker cabinet enclosures is believed to be produced by the flat parallel surfaces on the interiors of such enclosures. The radiating sound waves within the enclosures strike these surfaces and bounce back and forth between them to set up standing waves within the enclosure. These standing waves interfere with the proper operation of the speaker in response to various frequencies across its range of response. Non-linear response characteristics and intermodulation distortion are quite noticeable even in the best of the prior art speaker systems.

The problems which are presented by flat surfaces on the inside of a speaker enclosure have been recognized in the past, and attempts have been made to overcome them. To avoid establishing standing waves within a speaker enclosure, speaker enclosures have been manufactured having a spherical or elliptical inner surface behind the speaker. By utilizing such curved inner surfaces in the speaker interior, the development of standing waves within the enclosure has been minimized. In the past, however, the development of such spherical speaker enclosures has been directed to infinite baffle speaker enclosures which require relatively large internal air volumes to achieve the desired operating results. As a consequence, spherical speaker enclosures have not achieved any notable degree of commercial acceptance.

It is desirable to provide a speaker enclosure which produces realistic sound reproduction without unnatural frequency argumentation at particular frequencies which is small in size, relatively inexpensive to manufacture, and which has improved efficiency.

SUMMARY OF THE INVENTION

Accordingly it is an object of this invention to provide an improved speaker enclosure.

It is another object of this invention to provide a speaker enclosure system with improved high fidelity reproduction capabilities.

It is an additional object of this invention to provide a speaker enclosure with improved efficiency.

It is a further object of this invention to provide an improved loudspeaker/enclosure system utilizing a sealed air enclosure having a hollow interior, each cross section of which is a continuous closed curve.

It is still another object of this invention to provide an improved loudspeaker/enclosure system which operates on the principle of equalizing pressures on the interior of the enclosure cabinet when the loudspeaker mounted in the cabinet is producing sounds.

In accordance with a preferred embodiment of this invention, an enclosure and loudspeaker combination comprises a molded foamed plastic shell having a hollow interior, each cross section of which is a continuous curve. An aperture is formed in the plastic shell and a loudspeaker is mounted in the aperture. The dimensions of the loudspeaker are related to the volume of the interior of the enclosure to cause pressure changes resulting from the excursions of the diaphragm of the loudspeaker to be equalized on the interior of the enclosure. In a more specific implementation of the invention, the volume "V" of the interior of the enclosure shell is determined according to the formula:

$$V=[MD]^3$$

where M is the distance between the limits of mechanical excursion of the diaphragm of the loudspeaker moved by a constant mechanical force and D is the diameter of the loudspeaker.

DETAILED DESCRIPTION OF THE PREFERRED EMBODIMENT

Figure 1:
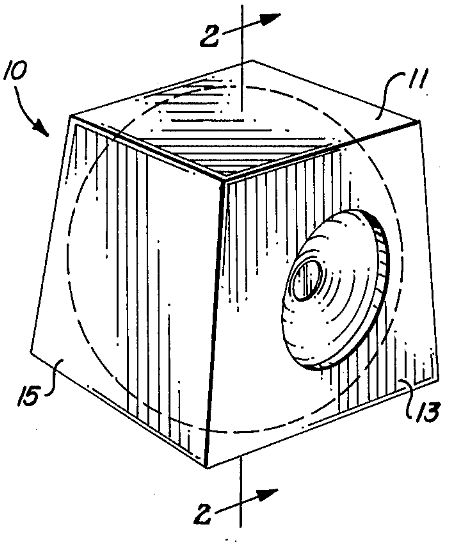
FIG. 1 is a front perspective view of a preferred embodiment of the invention.

In the drawings, the same reference numbers are used throughout the different figures to designate the same or similar components.

Figure 2:
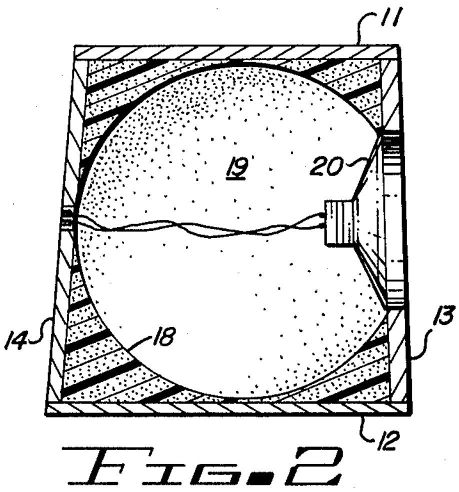
FIG. 2 is a cross-sectional view taken along the line 2—2 of FIG. 1.
Figure 3:
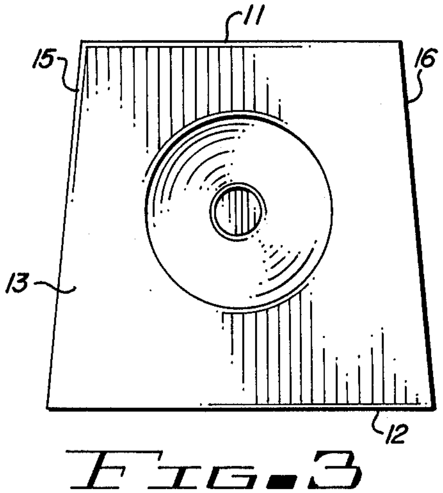
FIG. 3 is a front view of the embodiment shown in FIG. 1.

Referring now to FIGS. 1 to 3, there is shown a preferred embodiment of a loudspeaker and enclosure combination made in accordance with this invention. The speaker enclosure is in the form of an outer enclosure cabinet 10 which has a top 11, a bottom 12, front 13, back 14 and a pair of sides 15 and 16. As shown in FIGS. 1 to 3, this outer enclosure 10 is of a generally trapezoidal shape; but the shape of this part of the cabinet can be in any desired shape capable of accommodating the interior speaker structure. As a consequence, the aesthetic appearance of the cabinet can be varied to suit a wide variety of tastes.

This outside structure of the loudspeaker cabinet preferably is made of rigid materials such as wood, plastic or the like to impart strength and structural rigidity to the completed cabinet structure. Because of the manner in which the cabinet is made, however, these outer members 11 to 16 of the cabinet need not have the structural rigidity normally required for high fidelity speaker enclosure cabinets. This is because substantial structural strength is provided for these external cabinet surfaces by the interior structure of the cabinet shown in FIGS. 1 through 3.

The loudspeaker and cabinet enclosure combination which is shown in FIGS. 1 to 3 operates on the "acoustic suspension" principle which, as is well known, depends on the retention of a fixed mass of air (at least fixed in response to the variations in frequency encountered in the speaker operation) within the enclosure behind the speaker. As a consequence, with the speaker sealed into an aperture in such an acoustic suspension cabinet, the volume of air within the speaker acts as a spring to restore the speaker to its neutral or unoperated position; so that the mechanical restoring forces of the speaker diaphragm do not need to be as strong as with speaker enclosures of other types.

While acoustic suspension speakers have permitted a substantial reduction in the size of loudspeaker cabinets and also produce improved acoustic accuracy over other speaker designs, a primary disadvantage of such speaker enclosures has been their inefficiency. The acoustic or air suspension system uses substantially more amplifier energy because the speaker woofer works against the fixed air mass, and as a result considerably more amplifier power is required to obtain a desired sound level from ordinary air suspension speaker designs that from the older bass reflex enclosures.

With the design of the interior of the speaker enclosure to the form shown in FIGS. 1 and 2, considerable increase in the efficiency of the air suspension or acoustic suspension speaker has been realized. As shown in FIGS. 1 and 2, the interior of the speaker enclosure is in the form of a hollow sphere which is formed by molding a discrete closed cellular foamed polyurethane plastic structure 18 into the corners and sides of the outside enclosure walls 11 through 16 to form a hollow spheriod chamber 19 behind a speaker 20, which is mounted in an aperture formed through the front wall 13 of the cabinet. The speaker 20 may be mounted in the aperture by any of a number of conventional mounting techniques commonly employed with acoustic suspension speaker systems. These techniques assure proper mounting of the speaker while sealing the aperture from transmission of air between the outside of the enclosure and the interior chamber 19.

By experimentation, it has been determined that an ideal density of the polyurethane foam 18 is two to four pounds per cubic foot. The interior surface of the foam 18, which forms the chamber 19, is left in its generally porous or roughened state; so that it absorbs some of the sound waves which are generated in the chamber 19 behind the speaker 20. This is in contrast to many speaker interior surfaces which are made of relatively high density to form a hard surface. Even though the interior surface of the chamber 19 is relatively "soft," low frequency signals traveling from the speaker 20 into the interior chamber 19 bounce away from the internal walls of the chamber 19 and return to the speaker 20 in an equal pressure fashion to improve the efficiency of the sound reproduction. This phenomenon is constant over the low frequency response range (the range which is the most critical one to reproduce in high fidelity sound systems); so that no unequal frequency peaking occurs and the resultant sound from the speaker is a very natural sound.

The hollow spherical interior 19 of the enclosure is a preferred form of a more general interior configuration which is a continuous closed curve in all cross sections. Other internal configurations such as ellipsoid, paraboloid, and the like could be utilized, but the spheriodal interior appears to be the ideal. The utilization of such a curved interior eliminates all flat or parallel surfaces from the speaker interior and also eliminates all sharp corners. As a consequence, the spheriodal sound waves which emanate from the diaphragm of the speaker 20 into the interior 19 of the speaker enclosure are equalized in pressure throughout the interior in contrast to the aberrations which are created on the interiors of box-like speaker enclosures of conventional designs. These aberrations in the sound waves bouncing around on the interior of conventional speakers are believed to cause considerable intermodulation distortion, which is present in even the most expensive acoustic suspension speaker systems. This distortion is detected by the ear as unnatural sound, that is, sound which is not a faithful reproduction of the original sound source as it is heard live or as it is captured in the recording which is being reproduced by the speaker system.

Through experimentation, it has been found that it is necessary to match the volume (V) of the hollow interior 19 of the speaker enclosure to the diameter and limits of mechanical excursion of the loudspeaker in accordance with the following empirical formula:

$$V=[MD]^3$$

where M is the distance between the limits of mechanical excursion of the loudspeaker used in the cabinet as the diaphragm of the speaker is moved to these limits by a constant mechanical force, and D is the diameter of the loudspeaker. By utilizing this formula to obtain the optimum operating characteristics for any given speaker 20, maximum performance levels are obtained with a considerably smaller overall external size of the speaker enclosure 10 compared with the sizes presently employed for acoustic suspension speaker systems. As a consequence, previously "unusable" sizes are now usable in acoustic suspension speaker systems without any sacrifice in sound quality.

The smaller size and the resultant smaller volume of air behind the speaker 20 of the system in FIGS. 1, 2 and 3 also results in increased efficiency from the speaker system. This has been verified in direct comparative testing between the speaker enclosure combination of FIGS. 1, 2 and 3 and conventional acoustic suspension speaker systems. The results of one such direct comparative test are shown in FIG. 4.

Figure 4:
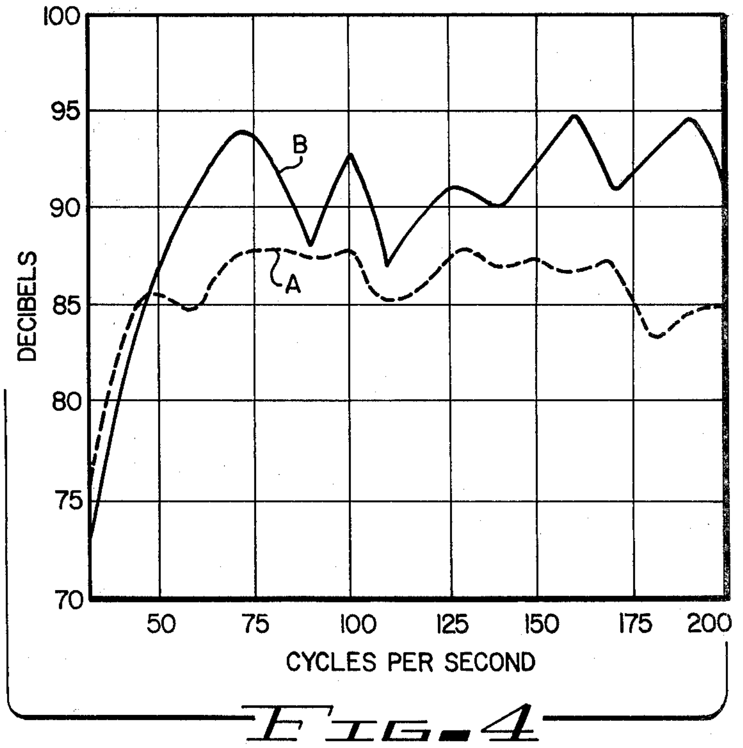
FIG. 4 illustrates comparative waveforms useful in explaining the results achieved in the operation of the loudspeaker enclosure embodiment shown in FIGS. 1-3.

FIG. 4 illustrates the results of measurements of the sound pressure level (SPL) at a distance of one meter from the loudspeaker systems used in the test. The measurements were made over a range of 0 to 200 cycles per second, the critical bass frequency range which is most difficult to reproduce accurately in a loudspeaker system. The output decibels at these different frequencies are illustrated by the curves. In both cases, the curves were produced by the same loudspeaker, an 8 inch diameter EPI-150. The dotted line curve A is the sound pressure level of this loudspeaker when it is mounted in its conventional acoustic suspension cabinet. Curve B is the same loudspeaker mounted in a cabinet enclosure of the type shown in FIGS. 1 through 3. In both cases, the measurements were made with an input drive to the speaker of one watt rms, which for this speaker was produced by an input voltage of 2.82 volts. With the exception of the cabinet enclosure, all other parameters of the test were identical.

While there were more fluctuations in the sound pressure level over the frequency range when the speaker was mounted in the enclosure of FIGS. 1 through 3, these variations at these frequencies are essentially undectable to the human ear. Of considerable importance is the higher output level which is obtained across the entire frequency spectrum with the enclosure of FIGS. 1 through 3. The significance of this is readily apparent when one realizes that for every three db output increases from a loudspeaker system, it is necessary to approximately double the power of the amplifier driving the system. To state it another way, the comparison of curves A and B of FIG. 4 illustrates that the loudspeaker system of FIGS. 1 through 3 (Curve B) is considerably more efficient than when the same loudspeaker is used in a conventional acoustic suspension cabinet. As a consequence, amplifiers with less power than required for conventional acoustic suspension speaker systems may be used to drive loudspeakers in cabinets of the type illustrated in FIGS. 1 through 3 without any sacrifice in the output sound level.

Of additional significance, the interior design of the chamber 19 of the loudspeaker described above prevents the formation of sound aberrations and internal standing waves; so that intermodulation distortion which is present in conventional loudspeaker systems, is effectively eliminated. The result of this is a pleasing natural sound throughout the entire frequency spectrum which the speaker is designed to reproduce and particularly at the low frequency end of the spectrum.

The efficiency of the 8 inch EPI-150 loudspeaker mounted in the cabinet of FIGS. 1 through 3, compared with the conventional acoustic suspension cabinet in which this speaker is normally mounted, was measured by driving the two systems used in the comparison with one watt, ten watts, and one hundred watts of pink noise for three different comparisons. Measuring the SPL at a distance of one meter, the loudspeaker in the cabinet of FIGS. 1 through 3 produced an output which was four db higher than the output of the standard speaker enclosure system. At ten watts the output was five db higher, and at one hundred watts it was eight db higher.

Figure 5:
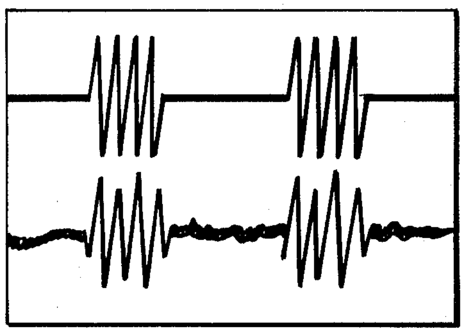
FIGS. 5 and 6 are waveforms illustrating tone burst responses useful in explaining the performances of the embodiment shown in FIGS. 1-3.
Figure 6:
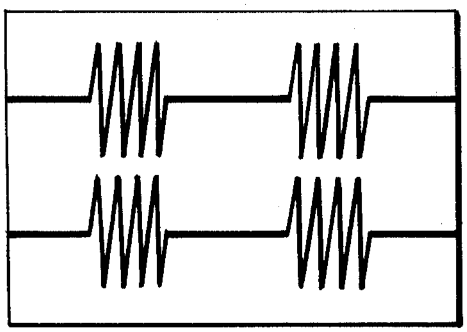

In addition to the improved characteristics which have been discussed above, the measured tone burst response also is significantly improved by mounting a loudspeaker in an enclosure of the type shown in FIGS. 1 through 3. FIGS. 5 and 6 illustrate actual oscilliscope traces of tone burst response at 100 hz for an eight inch EPI-150 loudspeaker mounted in its conventional cabinet (FIG. 5) and the same loudspeaker mounted in the cabinet shown in FIGS. 1 and 2 (FIG. 6) where the volume (V) of the cabinet interior 19 was determined according to the above-mentioned formula.

The upper waveform in both FIGS. 5 and 6 is the input waveform of a tone burst signal at 100 hz. The lower waveform in both figures shows the reproduction of the loudspeaker system. The conventional speaker enclosure used with the loudspeaker produced irregular amplitude variations (FIG. 5) which are of the type which are commonly accepted as the standard of performance for good loudspeaker systems in the industry. The lower waveform in FIG. 6 in contrast, however, shows a complete absence of these amplitude variations for the same loudspeaker used in the enclosure of FIGS. 1 to 3. The reproduction of the input tone burst signal is very faithful and as a consequence, results in a very realistic sound to the listener.

The foregoing description of the preferred embodiment of the invention shown in FIGS. 1 through 3 is illustrative of the principles of the invention only and is not to be considered limiting. As state above, other configurations of the internal cavity 19 of the loudspeaker enclosure may be employed in accordance with the principles of this invention in addition to the specific example shown in FIG. 2. In addition, various other modifications utilizing the principles of this invention will occur to those skilled in the art without departing from the scope of the following claims.

I claim:

1. An enclosure and loudspeaker combination comprising a molded foamed plastic shell having a hollow interior, the inner surface of which is porous and each cross section of which is a continuous curve, and having an aperture therethrough for mounting a loudspeaker of complementary dimensions to the dimensions of such aperture; and means for attaching said loudspeaker in said aperture to seal said aperture; the diameter of said loudspeaker and its limits of mechanical excursion being matched to the volume V of the interior of said shell according to the formula:

$$V=[MD]^3$$

where M is the distance between the limits of the mechanical excursion of the diaphram of said loudspeaker and D is the diameter of the loudspeaker; so that pressure changes caused by excursions of the diaphram of said loudspeaker are equalized on the interior of said shell.

2. An enclosure and loudspeaker combination according to claim 1 further including an outer cabinet wherein said molded foamed plastic shell is within said outer cabinet, so that said outer cabinet provides structural rigidity to said combination and is of a shape independent of the shape of the interior of said foamed plastic shell.

3. An enclosure and loudspeaker combination according to claim 1 wherein said molded shell has a hollow spherical interior.

4. The combination according to claim 1 wherein said foamed plastic shell is formed of foamed plastic having a discrete closed cellular structure of a density in the range of two to four pounds per cubic foot.

5. The combination according to claim 4 wherein said foamed plastic shell is made of polyurethane foam.

6. An enclosure and loudspeaker combination comprising a molded foamed plastic shell made of foamed plastic having a discrete closed cellular structure of a density in the range of two to four pounds per cubic foot and having a hollow interior, each cross section of which is a continuous closed curve, and having an aperture therethrough for mounting a loudspeaker of complementary dimensions to the dimensions of such aperture; and means for attaching said loudspeaker in said aperture to seal said aperture; where the volume V of the interior of said shell is determined according to the formula:

$$V=[MD]^3$$

where M is the distance between the limits of mechanical excursion of the diaphragm of said loudspeaker and D is the diameter of the loudspeaker; and an outer cabinet around said shell providing structural rigidity to the combination and having a shape independent of the shape of the interior of said shell.

7. The combination according to claim 6 wherein said shell is made of polyurethane foam.

8. The combination according to claim 6 wherein said shell has a hollow spherical interior.

* * * * *